US010423256B2

United States Patent
Xu et al.

(10) Patent No.: US 10,423,256 B2
(45) Date of Patent: Sep. 24, 2019

(54) ORGANIC LIGHT EMITTING TOUCH DISPLAY PANEL, MANUFACTURING METHOD THEREOF, AND DISPLAY DEVICE

(71) Applicant: BOE Technology Group Co., Ltd., Beijing (CN)

(72) Inventors: Rui Xu, Beijing (CN); Xue Dong, Beijing (CN); Jing Lv, Beijing (CN); Haisheng Wang, Beijing (CN); Xiaochuan Chen, Beijing (CN); Yingming Liu, Beijing (CN); Lijun Zhao, Beijing (CN); Changfeng Li, Beijing (CN); Pinchao Gu, Beijing (CN); Xiangxiang Zou, Beijing (CN); Xiaoliang Ding, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 45 days.

(21) Appl. No.: 15/569,037

(22) PCT Filed: Jun. 28, 2017

(86) PCT No.: PCT/CN2017/090647
§ 371 (c)(1),
(2) Date: Oct. 24, 2017

(87) PCT Pub. No.: WO2018/120698
PCT Pub. Date: Jul. 5, 2018

(65) Prior Publication Data
US 2018/0284933 A1 Oct. 4, 2018

(30) Foreign Application Priority Data

Dec. 27, 2016 (CN) .......................... 2016 1 1226642

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/042* (2013.01); *G06F 3/0416* (2013.01);
(Continued)

(58) Field of Classification Search
None
See application file for complete search history.

(56) References Cited

U.S. PATENT DOCUMENTS

2015/0364527 A1* 12/2015 Wang .................. H01L 27/3225
257/40
2016/0043265 A1* 2/2016 Humbert .............. G01N 21/766
438/49
2017/0162121 A1* 6/2017 Yang ........................ G06F 3/007

FOREIGN PATENT DOCUMENTS

CN 103913449 A 7/2014
CN 105304673 A 2/2016
(Continued)

OTHER PUBLICATIONS

Aug. 17, 2017—(WO) International Search Report and Written Opinion Appn PCT/CN2017/090647 with English Tran.

*Primary Examiner* — Kenneth B Lee, Jr.
(74) *Attorney, Agent, or Firm* — Banner & Witcoff, Ltd.

(57) ABSTRACT

An organic light emitting touch display panel, a manufacturing method thereof, and a display device are provided. The organic light emitting touch display panel includes: a base substrate; touch detection units disposed on the base substrate, each of the touch detection units includes a photosensitive element; signal input lines and signal output lines disposed on the base substrate, the signal input lines and the signal output lines correspond to the touch detection (Continued)

units one to one respectively, each of the signal input lines connects to an input end of the photosensitive element in its corresponding touch detection unit, each of the signal input lines configures to load a touch detection signal; each of the signal output lines connects to an output end of the photosensitive element in its corresponding touch detection unit, each of the signal output lines configures to output a current of the photosensitive element.

20 Claims, 3 Drawing Sheets

(51) Int. Cl.
*G06F 3/042* (2006.01)
*H01L 27/12* (2006.01)
(52) U.S. Cl.
CPC ........ *H01L 27/323* (2013.01); *H01L 27/3227* (2013.01); *G06F 2203/04103* (2013.01); *H01L 27/1214* (2013.01)

(56) References Cited

FOREIGN PATENT DOCUMENTS

| | | |
|---|---|---|
| CN | 106505090 A | 3/2017 |
| JP | 2016045307 A | 4/2016 |

\* cited by examiner

ORGANIC LIGHT EMITTING TOUCH DISPLAY PANEL, MANUFACTURING METHOD THEREOF, AND DISPLAY DEVICE

The application is a U.S. National Phase Entry of International Application No. PCT/CN2017/090647 filed on Jun. 28, 2017, designating the United States of America and claiming priority to Chinese Patent Application No. 201611226642.9, filed on Dec. 27, 2016. The present application claims priority to and the benefit of the above-identified applications and the above-identified applications are incorporated by reference herein in their entirety.

TECHNICAL FIELD

Embodiments of the present disclosure relate to an organic light emitting touch display panel, a manufacturing method thereof, and a display device.

BACKGROUND

OLED devices (organic light emitting display devices) have advantages of high contrast, thin thickness, wide viewing angle and fast reaction speed. OLED devices are beginning to gradually replace LCD (Liquid Crystal Display) devices.

At present, most OLED devices on the market only have a display function, and an external touch screen needed to be attached on each of the OLED devices to achieve a touch function. Compared with the LCD device with an in cell touch structure (that is, touch elements are integrated inside a display panel of the LCD device), the OLED devices having the touch function realized by attaching the additional touch screen is too thick and thus has no thickness advantage. Another method usually used is depositing a metal film and an insulating layer film by a low temperature sputtering method to manufacture a capacitive touch structure on a TFE (thin film encapsulation) film of the OLED device. However, the encapsulation yield of the product manufactured by this method is very low.

SUMMARY

An organic light emitting touch display panel, a manufacturing method thereof, and a display device are provided by at least one embodiment of the present disclosure. The organic light emitting touch display panel integrates touch elements inside the display panel so as to realize a touch function and a display function.

At least one embodiment of the present disclosure provides an organic light emitting touch display panel, and the organic light emitting touch display panel comprises: a base substrate; a plurality of touch detection units disposed on the base substrate, wherein each of the touch detection units comprises at least one photosensitive element; and signal input lines and signal output lines disposed on the base substrate, wherein the signal input lines correspond to the touch detection units one to one, and the signal output lines correspond to the touch detection units one to one; wherein each of the signal input lines is connected to an input end of the at least one photosensitive element in its corresponding touch detection unit, and each of the signal input lines is configured to load a touch detection signal; and each of the signal output lines is connected to an output end of the at least one photosensitive element in its corresponding touch detection unit, and each of the signal output lines is configured to output a current of the at least one photosensitive element.

For example, in the organic light emitting touch display panel provided by at least one embodiment of the present disclosure, the at least one photosensitive element is a photosensitive diode.

For example, in the organic light emitting touch display panel provided by at least one embodiment of the present disclosure, the photosensitive diode comprises a P pole, an N pole and an intrinsic layer provided in a same layer, the P pole and the N pole of the photosensitive diode are separated by the intrinsic layer, and the P pole and the N pole of the photosensitive diode are in contact with the intrinsic layer respectively.

For example, in the organic light emitting touch display panel provided by at least one embodiment of the present disclosure, each of the touch detection units comprises a plurality of photosensitive diodes, for each of the touch detection units, the signal input line corresponding to the touch detection unit is connected to the P pole of each photosensitive diode in the touch detection unit, and the signal output line corresponding to the touch detection unit is connected to the N pole of each photosensitive diode in the touch detection unit.

For example, in the organic light emitting touch display panel provided by at least one embodiment of the present disclosure, an area of each of the touch detection units is from 3 mm$^2$ to 5 mm$^2$.

For example, the organic light emitting touch display panel provided by at least one embodiment of the present disclosure, further comprises: an insulating layer, a thin film transistor array and a passivation layer arranged on the at least one photosensitive element, and an organic light emitting diode arranged on the passivation layer.

For example, in the organic light emitting touch display panel provided by at least one embodiment of the present disclosure, the insulating layer is provided with first via holes and second via holes, the first via holes correspond to the touch detection units one to one, and the second via holes correspond to the touch detection units one to one.

For example, in the organic light emitting touch display panel provided by at least one embodiment of the present disclosure, for each of the touch detection units, the input end of the at least one photosensitive element is connected to the corresponding signal input line by the first via hole corresponding to the touch detection unit, and the output end of the at least one photosensitive element is connected to the corresponding signal output line by the second via hole corresponding to the touch detection unit.

For example, in the organic light emitting touch display panel provided by at least one embodiment of the present disclosure, the signal input lines and the signal output lines are arranged between the insulating layer and the passivation layer.

At least one embodiment of the present disclosure provides a display device, and the display device comprises any one of the organic light emitting touch display panel described above.

For example, the display device provided by at least one embodiment of the present disclosure, further comprises a touch circuit, wherein an output end of the touch circuit is connected to the signal input lines of the organic light emitting touch display panel, and the output end of the touch circuit is configured to load the touch detection signal to the signal input lines; an input end of the touch circuit is connected to the signal output lines of the organic light emitting touch display panel, and the input end of the touch circuit is configured to receive the current output by the at least one photosensitive element through the signal output lines, and the touch circuit identifies a touch operation according to a change of the current of the at least one photosensitive element.

At least one embodiment of the present disclosure provides a manufacturing method of an organic light emitting touch display panel, and the manufacturing method comprises: providing a base substrate; forming a plurality of touch detection units on the base substrate, wherein each of the touch detection units comprises at least one photosensitive element; and forming signal input lines and signal output lines on the base substrate, wherein the signal input lines correspond to the touch detection units one to one, and the signal output lines correspond to the touch detection units one to one; wherein each of the signal input lines is connected to an input end of the at least one photosensitive element in its corresponding touch detection unit, and each of the signal input lines is configured to load a touch detection signal; and each of the signal output lines is connected to an output end of the at least one photosensitive element in its corresponding touch detection unit, and each of the signal output lines is configured to output a current of the at least one photosensitive element.

For example, in the manufacturing method provided by at least one embodiment of the present disclosure, the at least one photosensitive element is a photosensitive diode, and forming the at least one photosensitive element on the base substrate comprises: forming an intrinsic film on the base substrate; patterning the intrinsic film to form an intrinsic pattern, wherein the intrinsic pattern comprises a first portion, a second portion, and a third portion arranged in sequence; doping the first portion with hydrogen phosphide $BH_3$ to obtain a P pole of the photosensitive diode, and doping the second portion with phosphine $PH_3$ to obtain an N pole of the photosensitive diode.

For example, in the manufacturing method provided by at least one embodiment of the present disclosure, each of the touch detection units comprises a plurality of photosensitive diodes, for each of the touch detection units, the signal input line corresponding to the touch detection unit is connected to the P pole of each photosensitive diode in the touch detection unit, and the signal output line corresponding to the touch detection unit is connected to the N pole of each photosensitive diode in the touch detection unit.

For example, the manufacturing method provided by at least one embodiment of the present disclosure further comprises: forming an insulating layer, a thin film transistor array and a passivation layer on the at least one photosensitive element; and forming an organic light emitting diode on the passivation layer.

For example, the manufacturing method provided by at least one embodiment of the present disclosure further comprises: forming first via holes and second via holes in the insulating layer by a patterning process, wherein the first via holes correspond to the touch detection units one to one, and the second via holes correspond to the touch detection units one to one.

For example, in the manufacturing method provided by at least one embodiment of the present disclosure, for each of the touch detection units, the input end of the at least one photosensitive element is connected to the corresponding signal input line by the first via hole corresponding to the touch detection unit; and the output end of the at least one photosensitive element is connected to the corresponding signal output line by the second via hole corresponding to the touch detection unit.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the words such as "comprising", "include", etc., mean the components or objects that appear in front of the words to cover the similar components or objects that are listed in the following of the words, but other different components or objects are not excluded. The phrases "connect", "connected", etc., are not intended to define a physical connection or mechanical connection, but may include an electrical connection, directly or indirectly. The terms "up", "down", "left", "right", etc., are used to indicate the relative position relation, when the absolute position of the described object is changed, the relative position relation may also be changed accordingly.

A size of each of the patterns in the organic light emitting touch display panel according to the embodiments of the present disclosure is usually micron or smaller scale in the actual product. For the sake of clarity, the size of each of the structures illustrated in each of the figures of the present disclosure is amplified, unless otherwise expressly stated, the size of each of the structures does not represent the actual size and the actual proportion.

At present, the method of integrating touch elements inside a display panel of an organic light emitting device has a problem that a thickness of the display panel is too large and thus has no thickness advantage, or a problem that the packaging yield of the product manufactured by the method is reduced.

Figure 1:
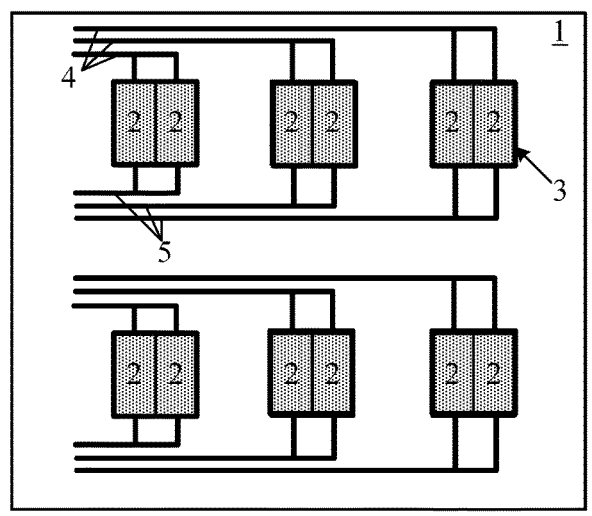
FIG. 1 is a schematic diagram of a planar structure of an organic light emitting touch display panel provided by an embodiment of the present disclosure.

At least one embodiment of the present disclosure provides an organic light emitting touch display panel, for example, FIG. 1 is a schematic diagram of a planar structure of an organic light emitting touch display panel provided by an embodiment of the present disclosure. As illustrated in FIG. 1, the organic light emitting touch display panel comprises: a base substrate 1; a plurality of touch detection units 3 disposed on the base substrate 1, each of the touch detection units 3 comprises at least one photosensitive element 2; and signal input lines 4 and signal output lines 5 disposed on the base substrate 1, the signal input lines 4 correspond to the touch detection units 3 one to one, and the signal output lines 5 correspond to the touch detection units 3 one to one. Each of the signal input lines 4 is connected to an input end of the at least one photosensitive element 2 in its corresponding touch detection unit 3, and each of the signal input lines 4 is configured to load a touch detection signal (for example, configured to load a touch detection signal from a touch circuit); and each of the signal output lines 5 is connected to an output end of the at least one photosensitive element 2 in its corresponding touch detection unit 3, and each of the signal output lines 5 is configured to output a current of the at least one photosensitive element 2 (for example, outputting current into a touch circuit). Thus, the touch circuit identifies a touch operation according to a change of the current of the at least one photosensitive element 2.

It should be noted that, FIG. 1 illustrates an example that two photosensitive elements 2 constitute one touch detection unit 3. For another example, one photosensitive element 2 constitutes one touch detecting unit 3, still for another example, two or more photosensitive elements 2 constitute one touch detection unit 3, which is not limited herein.

In a case that a user touches the organic light emitting touch display panel as illustrated in FIG. 1, for example, in a case that the user touches the organic light emitting touch display panel by a finger or a stylus, a portion of the incident light from the outside is blocked. As a result, the currents of the photosensitive elements 2 change, in at least one embodiment of the present disclosure, the touch operation is identified according to the change of the currents of the photosensitive elements.

The photosensitive elements 2 in at least one embodiment of the present disclosure is disposed on the base substrate 1, and the photosensitive elements 2 are arranged in a cell of the display panel so as to realize a design of integrating the touch elements inside the OLED panel. Thus, the thickness of the OLED panel with a touch function in an embodiment of the present disclosure is reduced and is less than that of most of the existing touch display panels. At present, the OLED devices adopt a capacitive touch structure, and the capacitive touch structure needs to sputter a metal layer on a TFE (thin film encapsulation) film. However, sputtering the metal layer on the TFE film has a high requirement on process, so that the yield of the product is low. In at least one embodiment of the present disclosure, traditional capacitive touch structure is replaced by the photosensitive elements, the photosensitive elements only need to be arranged on the base substrate, which has a lower process requirement, so that the yield of the product is improved. Thus, the display panel provided by at least one embodiment of the present disclosure has a high practical value.

In the following, the organic light emitting touch display panel provided by at least one embodiment of the present disclosure is described in detail.

Figure 2:
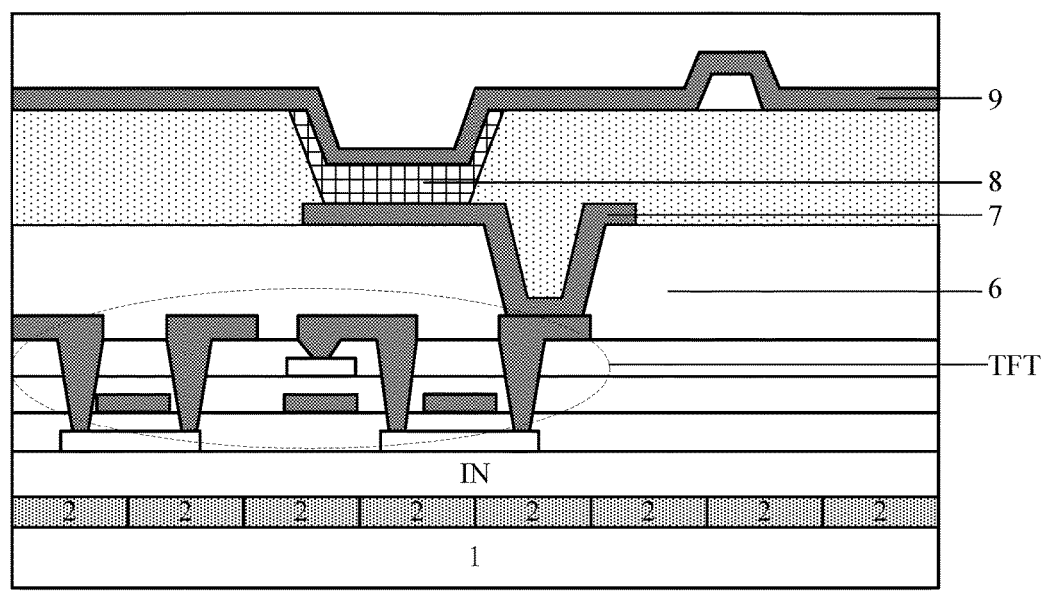
FIG. 2 is a schematic diagram of a section structure of an organic light emitting touch display panel provided by an embodiment of the present disclosure.

FIG. 2 is a schematic diagram of a section structure of an organic light emitting touch display panel provided by an embodiment of the present disclosure. As illustrated in FIG. 2, the organic light emitting display panel comprises: a base substrate 1; a plurality of photosensitive elements 2 disposed on the base substrate 1; an insulating layer IN disposed on the plurality of photosensitive elements 2; signal input lines (not illustrated in FIG. 2), signal output lines (not illustrated in FIG. 2), and a thin film transistor (TFT) array which are arranged on the insulating layer IN; a passivation layer 6 arranged on the signal input lines, the signal output lines and the TFT array; an organic light emitting diode disposed on the passivation layer 6, for example, the organic light emitting diode comprises an anode 7, a cathode 9, and an organic light emitting layer 8 disposed between the anode 7 and the cathode 8.

Figure 3:
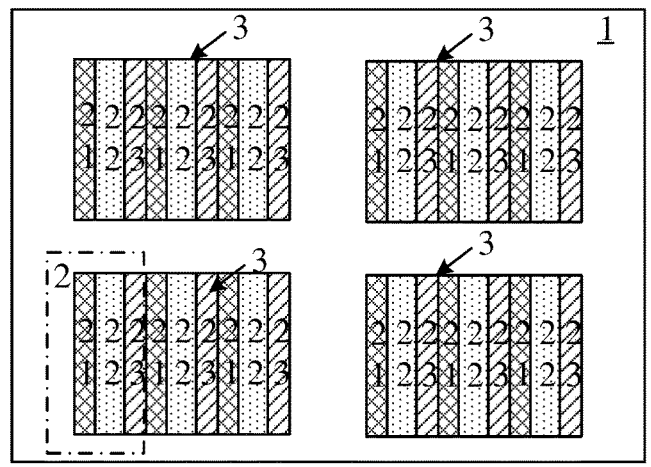
FIG. 3 is a schematic diagram of photosensitive elements of an organic light emitting touch display panel provided by an embodiment of the present disclosure.

For example, in at least one embodiment of the present disclosure, the photosensitive elements are PIN junction photosensitive diodes. For example, FIG. 3 is a schematic diagram of photosensitive elements of an organic light emitting touch display panel provided by an embodiment of the present disclosure. As illustrated in FIG. 3, each of the PIN junction photosensitive diodes 2 comprises a P pole 21, an N pole 23 and an intrinsic layer 22 provided in a same layer, the P pole 21 and the N pole 23 are separated by the intrinsic layer 22 in each of the PIN junction photosensitive diodes 2, and the P pole 21 and the N pole 22 are in contact with the intrinsic layer 22 in each of the PIN junction photosensitive diodes 2 respectively.

For example, each of touch detection units 3 comprises a plurality of PIN junction photosensitive diodes; for each touch detection unit 3, the P poles 21 of all of the photosensitive diodes in the touch detection unit are input ends of the touch detection unit 3, and the N poles 23 of all of the photosensitive diodes in the touch detection unit are output ends of the touch detection unit 3.

In general, a thin film photosensitive diode has a structure that films are stacked in sequence, and a thickness of the thin film photosensitive diode is from 0.8 μm to 1 μm. In at least one embodiment of the present disclosure, all the photosensitive diodes on the base substrate are arranged in a monolayer structure with a thickness of 3000 Å, so that the number of the films stacked on the base substrate is reduced. In addition, the photoelectric characteristics of the PIN photosensitive diode with a horizontal structure are superior to that of the PIN photodiode with a vertical structure.

For example, for each touch detection unit 3, the signal input line corresponding to the touch detection unit 3 is connected with the P poles 21 of all of the photosensitive diodes 2 in the touch detection unit 3, and the signal output line corresponding to the touch detection unit 3 is connected with the N poles 23 of all of the photosensitive diodes 2 in the touch detection unit 3.

Figure 4:
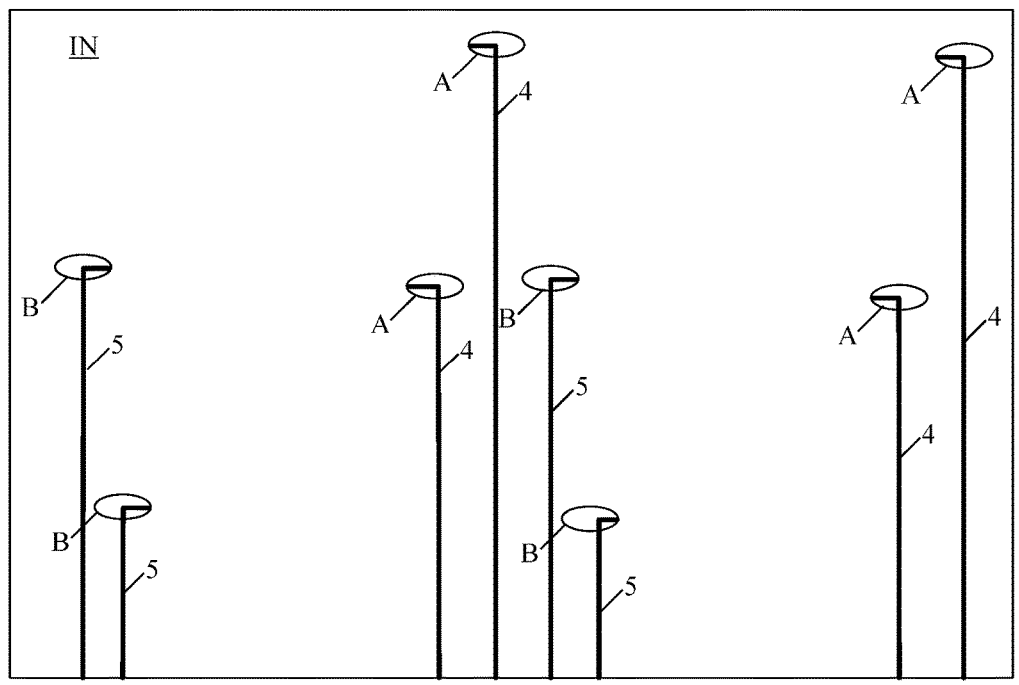
FIG. 4 is a schematic diagram of a connection between photosensitive elements and lines of an organic light emitting touch display panel provided by an embodiment of the present disclosure.

For example, FIG. 4 is a schematic diagram of a connection between photosensitive elements and lines of an organic light emitting touch display panel provided by an embodiment of the present disclosure. As illustrated in FIG. 4, the insulating layer IN is provided with first via holes A and second via holes B, and the first via holes A correspond to the touch detection units one to one, and the second via holes B correspond to the touch detection units one to one.

For example, for each of the touch detection units, the input ends of the photosensitive elements 2 (the P poles 21 of the photosensitive diodes) are connected to the corresponding signal input line 4 by the first via holes A corresponding to the touch detection unit 3; and the output ends of the photosensitive elements 2 (the N poles 23 of the photosensitive diodes) are connected with the corresponding signal output line 5 by the second via holes B corresponding to the touch detection unit 3.

For example, an area of each of the touch detection units is from 3 mm$^2$ to 5 mm$^2$ for touch. It is understood that, the area of each of the touch detection units may be set according to a size of a pixel of the display device, which is not limited herein.

At least one embodiment of the present disclosure further provides a display device, and the display device comprises any one of the above mentioned organic light emitting touch display panel. Based on the above organic light emitting touch display panels, the display device in the embodiments of the present disclosure achieves the in cell touch, the display device has a smaller cell thickness and conforms to a current trend of the ultra-thin development of display device.

For example, the display device further comprises a touch circuit, an output end of the touch circuit is connected to the signal input lines of the organic light emitting touch display panel, and the output end of the touch circuit is configured to load the touch detection signal to the signal input lines; an input end of the touch circuit is connected to the signal output lines of the organic light emitting touch display panel, and the input end of the touch circuit is configured to receive the current output by the at least one photosensitive element through the signal output lines, and the touch circuit identifies touch operations according to a change of the current of the photosensitive elements.

For example, the principle of identification is: in a case that each of the photosensitive elements is a PIN junction photosensitive diode, the P pole of the photosensitive diode receives the touch detection signal of the touch circuit to achieve voltage scanning, and the N pole of the photosensitive diode output current to the touch circuit.

Figure 5:
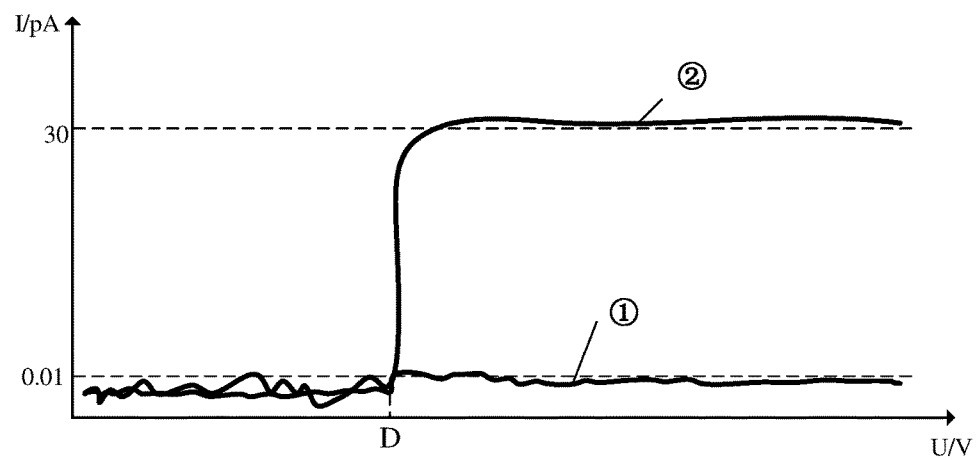
FIG. 5 is a schematic diagram of a change of a current of a photosensitive element of an organic light emitting touch display panel in a touch operation process provided by an embodiment of the present disclosure.

For example, FIG. 5 is a schematic diagram of a change of a current of a photosensitive element of an organic light emitting touch display panel in a touch operation process provided by an embodiment of the present disclosure. As illustrated in FIG. 5, in a case that the photosensitive diode is turned on when a voltage is D, the current value of the photosensitive diode is very low without light, as illustrated in the curve ①, the current approaches to 0.01 pA. In a case that the photosensitive diode is illuminated by light and a touch does not occur, the intensity of light obtained by all of the touch detection units is the same, the current value of each of the photosensitive diodes is illustrated in the curve ②, the current approaches from 30 to 40 pA, and the current values output by the touch detection units to the touch circuit are basically the same. In a case that the touch screen is touched by the finger, the light received by the photosensitive diode at the position of touch is shaded by the finger, and the current value is changed. Thus, the current value output to the touch circuit from the touch detection unit that the photosensitive diode belongs to is changed, and the touch circuit recognizes the region corresponding to the touch detection unit with changed current as the touch position.

For example, at least one embodiment of the present disclosure further provides a manufacturing method of an organic light emitting touch display panel, and the manufacturing method comprises: providing a base substrate; forming a plurality of touch detection units on the base substrate, in which each of the touch detection units comprises at least one photosensitive element; and forming signal input lines and signal output lines on the base substrate, in which the signal input lines correspond to the touch detection units one to one, the signal output lines correspond to the touch detection units one to one, each of the signal input lines is connected to an input end of the at least one photosensitive element in its corresponding touch detection unit, each of the signal input lines is configured to load a touch detection signal, each of the signal output lines is connected to an output end of the at least one photosensitive element in its corresponding touch detection unit, and each of the signal output lines is configured to output a current of the at least one photosensitive element.

Figure 6A:
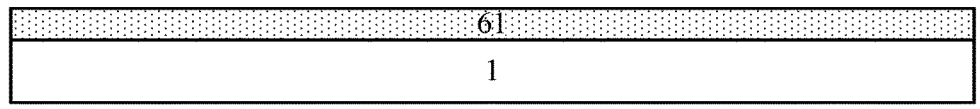
FIG. 6A to FIG. 6C are schematic diagrams of a manufacturing method of an organic light emitting touch display panel provided by an embodiment of the present disclosure.
Figure 6B:
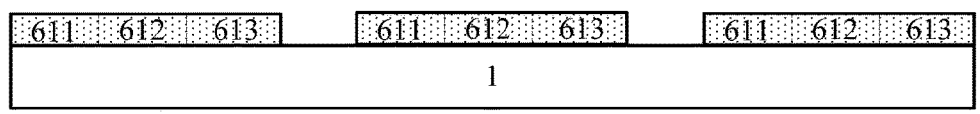
Figure 6C:
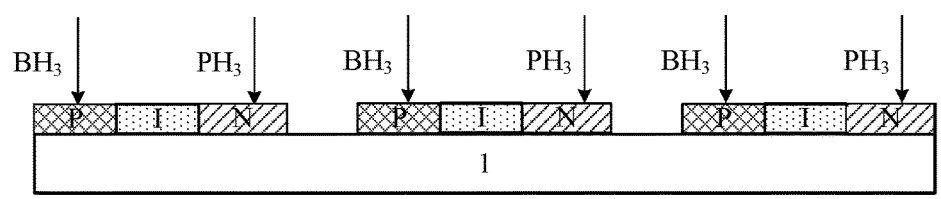

For example, in at least one embodiment of the present disclosure, the at least one photosensitive element is a PIN junction photosensitive diode, the forming the at least one photosensitive element on a base substrate comprises:

Step 1, referring to FIG. 6A, forming an intrinsic film 61 on a base substrate 1;

Step 2, referring to FIG. 6B, patterning the intrinsic film 61 to form an intrinsic pattern, in which the intrinsic pattern comprises a first portion 611, a second portion 612, and a third portion 613 which are arranged in sequence;

Step 3, referring to FIG. 6C, doping the first portion 611 in FIG. 6B with hydrogen phosphide BH$_3$ to obtain a P pole of the photosensitive diode, and doping the second portion 612 with phosphine PH$_3$ to obtain an N pole of the photosensitive diode. Finally, a photosensitive diode of a single layer structure illustrated in FIG. 6C is generated.

For example, each of the touch detection units comprises a plurality of photosensitive diodes, for each of the touch detection units, the signal input line corresponding to the touch detection unit is connected with the P poles of all of the photosensitive diodes in the touch detection unit, and the signal output line corresponding to the touch detection unit is connected with the N poles of all of the photosensitive diode in the touch detection unit.

For example, the manufacturing method of the organic light emitting touch display panel further comprises: forming an insulating layer, a thin film transistor array and a passivation layer on the at least one photosensitive element in sequence; and forming an organic light emitting diode on the passivation layer. For example, the organic light emitting diode comprises an anode, a cathode, and an organic light emitting layer disposed between the anode and the cathode.

For example, the signal input lines and the signal output lines are formed between the insulating layer and the passivation layer.

For example, the manufacturing method of the organic light emitting touch display panel further comprises: forming first via holes and second via holes in the insulating layer by a patterning process, in which the first via holes correspond to the touch detection units one to one, and the second via holes correspond to the touch detection units one to one.

For example, for each of the touch detection units, the input end of the photosensitive element is connected to the corresponding signal input line by the first via hole corresponding to the touch detection unit, and the output end of the photosensitive element is connected to the corresponding signal output line by the second via hole corresponding to the touch detection unit.

As the display devices are developing in an ultra-thin trend, at present, an ultra-thin glass is usually used as the base substrates of the display devices. In the process of using ultra-thin glass as a substrate for manufacturing an organic light emitting touch display panel, the worse the flatness of each layer, the greater the stress on the ultra-thin glass, so that the ultra-thin glass is more easily to be damaged, and the yield of the product is reduced. In at least one embodiment of the present disclosure, in the process of manufacturing photosensitive diodes, only one layer is needed, compared with the present stacked structure, the whole layer structure on the base substrate is more smooth, which is benefit for the uniform and reduced stress of the base substrate.

According to at least one embodiment of the present disclosure, the photosensitive elements are arranged on the base substrate, after packaging the base substrate to obtain the display panel, the photosensitive elements are located in the cell of the display panel, thus, the in cell touch of the OLED is realized, that is, the thickness of the display panel is smaller than that of the common display panel. In addition, at present, the OLED devices adopt a capacitive touch structure, and the capacitive touch structure needs to sputter a metal layer on a TFE (thin film encapsulation) film. However, sputtering the metal layer on the TFE film has a high requirement on process, so that the yield of the product is low. According to at least one embodiment of the present disclosure, the traditional capacitive touch is replaced by the photosensitive element, and the photosensitive element only needs to be arranged on the base substrate, which needs a lower process requirement, so that the yield of the product is improved. Thus, the display panel provided by at least one embodiment of the present disclosure has a high practical value.

What are described above is related to the illustrative embodiments of the disclosure only and not limitative to the scope of the disclosure. Therefore, the scopes of the disclosure are defined by the accompanying claims.

The application claims priority of Chinese Patent Application No. 201611226642.9, filed on Dec. 27, 2016, the disclosure of which is incorporated herein by reference in its entirety as part of the present application.

What is claimed is:

1. An organic light emitting touch display panel, comprising:
    a base substrate;
    a plurality of touch detection units disposed on the base substrate, wherein each of the touch detection units comprises at least one photosensitive element; and
    signal input lines and signal output lines disposed on the base substrate, wherein the signal input lines correspond to the touch detection units one to one, and the signal output lines correspond to the touch detection units one to one;
    wherein each of the signal input lines is connected to an input end of the at least one photosensitive element in its corresponding touch detection unit, and each of the signal input lines is configured to load a touch detection signal; and
    each of the signal output lines is connected to an output end of the at least one photosensitive element in its corresponding touch detection unit, and each of the signal output lines is configured to output a current of the at least one photosensitive element.

2. The organic light emitting touch display panel according to claim 1, wherein the at least one photosensitive element is a photosensitive diode.

3. The organic light emitting touch display panel according to claim 2, wherein the photosensitive diode comprises a P pole, an N pole and an intrinsic layer provided in a same layer, the P pole and the N pole of the photosensitive diode are separated by the intrinsic layer, and the P pole and the N pole of the photosensitive diode are in contact with the intrinsic layer respectively.

4. The organic light emitting touch display panel according to claim 3, wherein
    each of the touch detection units comprises a plurality of photosensitive diodes,
    for each of the touch detection units, the signal input line corresponding to the touch detection unit is connected to the P pole of each photosensitive diode in the touch detection unit, and the signal output line corresponding to the touch detection unit is connected to the N pole of each photosensitive diode in the touch detection unit.

5. The organic light emitting touch display panel according to claim 1, wherein an area of each of the touch detection units is from 3 mm$^2$ to 5 mm$^2$.

6. The organic light emitting touch display panel according to claim 1, further comprising: an insulating layer, a thin film transistor array and a passivation layer arranged on the at least one photosensitive element, and an organic light emitting diode arranged on the passivation layer.

7. The organic light emitting touch display panel according to claim 6, wherein the insulating layer is provided with first via holes and second via holes, the first via holes correspond to the touch detection units one to one, and the second via holes correspond to the touch detection units one to one.

8. The organic light emitting touch display panel according to claim 7, wherein for each of the touch detection units, the input end of the at least one photosensitive element is connected to the corresponding signal input line by the first via hole corresponding to the touch detection unit, and the output end of the at least one photosensitive element is connected to the corresponding signal output line by the second via hole corresponding to the touch detection unit.

9. The organic light emitting touch display panel according to claim 6, wherein the signal input lines and the signal output lines are arranged between the insulating layer and the passivation layer.

10. A display device, comprising the organic light emitting touch display panel according to claim 1.

11. The display device according to claim 10, further comprising a touch circuit, wherein
    an output end of the touch circuit is connected to the signal input lines of the organic light emitting touch display panel, and the output end of the touch circuit is configured to load the touch detection signal to the signal input lines;
    an input end of the touch circuit is connected to the signal output lines of the organic light emitting touch display panel, and the input end of the touch circuit is configured to receive the current output by the at least one photosensitive element through the signal output lines, and the touch circuit identifies a touch operation according to a change of the current of the at least one photosensitive element.

12. A manufacturing method of an organic light emitting touch display panel, comprising:
    providing a base substrate;
    forming a plurality of touch detection units on the base substrate, wherein each of the touch detection units comprises at least one photosensitive element; and forming signal input lines and signal output lines on the base substrate, wherein the signal input lines correspond to the touch detection units one to one, and the signal output lines correspond to the touch detection units one to one;

wherein each of the signal input lines is connected to an input end of the at least one photosensitive element in its corresponding touch detection unit, and each of the signal input lines is configured to load a touch detection signal; and each of the signal output lines is connected to an output end of the at least one photosensitive element in its corresponding touch detection unit, and each of the signal output lines is configured to output a current of the at least one photosensitive element.

13. The manufacturing method according to claim 12, wherein the at least one photosensitive element is a photosensitive diode, and forming the at least one photosensitive element on the base substrate comprises:

forming an intrinsic film on the base substrate;

patterning the intrinsic film to form an intrinsic pattern, wherein the intrinsic pattern comprises a first portion, a second portion, and a third portion arranged in sequence;

doping the first portion with hydrogen phosphide $BH_3$ to obtain a P pole of the photosensitive diode, and doping the second portion with phosphine $PH_3$ to obtain an N pole of the photosensitive diode.

14. The manufacturing method according to claim 13, wherein each of the touch detection units comprises a plurality of photosensitive diodes, for each of the touch detection units, the signal input line corresponding to the touch detection unit is connected to the P pole of each photosensitive diode in the touch detection unit, and the signal output line corresponding to the touch detection unit is connected to the N pole of each photosensitive diode in the touch detection unit.

15. The manufacturing method according to according to claim 12, further comprising:

forming an insulating layer, a thin film transistor array and a passivation layer on the at least one photosensitive element;

and forming an organic light emitting diode on the passivation layer.

16. The manufacturing method according to according to claim 15, further comprising: forming first via holes and second via holes in the insulating layer by a patterning process, wherein the first via holes correspond to the touch detection units one to one, and the second via holes correspond to the touch detection units one to one.

17. The manufacturing method according to claim 16, wherein for each of the touch detection units, the input end of the at least one photosensitive element is connected to the corresponding signal input line by the first via hole corresponding to the touch detection unit, and the output end of the at least one photosensitive element is connected to the corresponding signal output line by the second via hole corresponding to the touch detection unit.

18. The organic light emitting touch display panel according to claim 2, wherein an area of each of the touch detection units is from 3 $mm^2$ to 5 $mm^2$.

19. The organic light emitting touch display panel according to claim 7, wherein the signal input lines and the signal output lines are arranged between the insulating layer and the passivation layer.

20. The manufacturing method according to according to claim 13, further comprising:

forming an insulating layer, a thin film transistor array and a passivation layer on the at least one photosensitive element;

and forming an organic light emitting diode on the passivation layer.

* * * * *